United States Patent [19]
Kwiatkowski

[11] Patent Number: 6,078,437
[45] Date of Patent: Jun. 20, 2000

[54] MICRO-OPTIC LENS WITH INTEGRAL ALIGNMENT MEMBER

[75] Inventor: Stephen L. Kwiatkowski, Sunnyvale, Calif.

[73] Assignee: Blue Sky Research, San Jose, Calif.

[21] Appl. No.: 09/162,455

[22] Filed: Sep. 28, 1998

[51] Int. Cl.[7] .................................................. G02B 13/18
[52] U.S. Cl. .......................................... 359/719; 359/710
[58] Field of Search .................................. 359/668, 710, 359/619, 719, 503, 896, 708; 65/102; 438/33; 430/321; 372/101

[56] References Cited

U.S. PATENT DOCUMENTS

| | | | |
|---|---|---|---|
| 5,080,706 | 1/1992 | Snyder et al. | 65/102 |
| 5,081,639 | 1/1992 | Snyder et al. | 372/101 |
| 5,155,631 | 10/1992 | Snyder et al. | 359/708 |
| 5,181,224 | 1/1993 | Snyder | 372/101 |
| 5,420,722 | 5/1995 | Bielak | 359/708 |
| 5,844,723 | 12/1998 | Snyder | 359/668 |
| 5,853,960 | 12/1998 | Tran et al. | 430/321 |
| 5,888,841 | 3/1999 | Snyder | 438/33 |

*Primary Examiner*—Georgia Epps
*Assistant Examiner*—David N. Spector
*Attorney, Agent, or Firm*—LaRiviere, Grubman & Payne, LLP

[57] ABSTRACT

Method for passively aligning micro-optical lenses with other elements, and devices resulting therefrom. The method taught herein is particularly well suited to effect the passive alignment of cylindrical microlenses with other elements or devices, such as laser diodes. Cylindrical microlenses formed according to the principles of the present invention include at least one alignment member including at least one alignment surface. Urging the cylindrical microlens into intimate mechanical contact with the element to which it is to be attached, and its attachment thereto results in micro-optical devices formed with a minimum of skilled labor, which devices reflect a superior degree of optical perfection.

31 Claims, 7 Drawing Sheets

MICRO-OPTIC LENS WITH INTEGRAL ALIGNMENT MEMBER

TECHNICAL FIELD

The present invention relates generally to micro-optical lenses, particularly cylindrical microlenses, and more particularly to cylindrical microlenses particularly adapted to passive alignment or semi-passive alignment. Such cylindrical microlenses may be passively or semi-passively aligned with electro-optical devices, including laser diodes and integrated optics, as well as other optical, electrical and electro-optical devices.

BACKGROUND OF THE INVENTION

Semiconductor laser diodes are efficient sources of laser radiation, however the highly divergent beam emitted from a semiconductor laser diode presents problems in many applications. The divergence of the semiconductor laser diode's beam is caused by its exit aperture which is very narrow along one axis (the "fast" axis, which is defined to be perpendicular to the laser junction), and much wider along the perpendicular axis (the "slow" axis, which is defined to be parallel to the laser junction). These two axes correspond to the Y and X axes, as will be later explained. The cross section of the beam emitted along the fast, or Y, axis is highly divergent due to diffraction effects. In comparison, the wider aperture, defined along the X axis, emits a beam cross section that diverges only slightly.

Laser diodes, or more properly, semiconductor lasers, are generally constructed according to well-known principles of semiconductor manufacturing technology. A discussion of these principles can be found in Richard R. Shurtz II, *Semiconductor Lasers and LEDs* in *Electronics Engineers' Handbook,* 3rd ed. (hereinafter "Shurtz") (Donald G. Fink and Donald Christiansen, eds. 1989).

To correct the divergence of the output beam from a laser diode, one particularly successful methodology has been to direct that beam through a particularly configured cylindrical microlens, and several patents and patent applications are directed to furthering this technology.

One such device of an early type is taught in U.S. Pat. No. 4,731,772, as referenced in U.S. Pat. No. 5,050,153

Another method for the fabrication of cylindrical microlenses of the type embodied in the present invention is taught in U.S. Pat. No. 5,155,631. According the '631 reference, a preferred method for fabrication of cylindrical microlenses starts by forming the desired shape as a glass preform. The preform is then heated to the minimum drawing temperature of the glass, and a fiber is drawn from it. The cross-sectional shape of the fiber bears a direct relation to the shape of the preform from which it was drawn, thus forming the polished microlens. During the drawing process, the lens surfaces so formed become optically smooth due to fire polishing.

In order to collimate the beam produced by a laser diode, the invention taught in U.S. Pat. No. 5,081,639 teaches the mounting of a cylindrical lens optically aligned with the laser diode to provide a beam of collimated light from the Y axis of the diode. The laser diode assembly taught therein includes a diffraction-limited cylindrical lens having a numerical aperture greater than 0.5 which is used to collimate a beam from a laser diode. A collimated beam is one which is neither converging nor diverging; i.e., the rays within the beam are travelling substantially parallel to one another.

U.S. Pat. No. 5,181,224 illustrates the use of cylindrical lenses to (inter alia) create a slowly diverging beam light. This lens may be said to be "circularizing" and, when installed on any of a variety of laser diodes is available as the "CIRCULASER®" diode available from Blue Sky Research in San Jose, Calif.

In U.S. patent application Ser. No. 08/837,002, entitled "MULTIPLE ELEMENT LASER DIODE ASSEMBLY INCORPORATING A CYLINDRICAL MICROLENS", there is described another diode/microlens system in which the microlens does not correct for astigmatism of the diode beam, but which is instead corrected downstream with a larger lens or other means. In this system, no active alignment is required to position the microlens adjacent to the laser diode facet, so automation of the process is rendered possible. However, other means are then required to correct for the astigmatism of the beam. These other means take the form of additional optical elements inserted into the beam emerging from the microlens.

In U.S. patent application Ser. No. 08/837,004, a laser diode/cylindrical microlens assembly is taught in which a crossed pair of cylindrical microlenses is attached to a substrate on which is mounted a laser diode chip. The microlenses are mounted with their flat surfaces facing the emitting facet of the diode, which arrangement provides for passive alignment and possible automated mounting, but requires no additional lenses for astigmatism correction. The crossed pair of lenses can collimate or focus the laser diode beam, for example focusing the beam into a single mode fiber.

U.S. Pat. No. 5,050,153 teaches a device related to the device taught in the '772 teaching. In this teaching, the device is implemented as a semiconductor laser optical head assembly utilizing a tilted plate for astigmatism correction in place of the cylindrical lens taught in the '772 reference.

To overcome the loss of optical efficiencies inherent in each of these designs, U.S. Pat. No. 5,181,224 utilizes a cylindrical microlens which with one optical element circularizes and corrects the astigmatism in the output beam of a semiconductor laser diode. To obtain these advantages, the cylindrical lenses must be aligned to tolerances less than 2 microns along at least one axis. This precision alignment has heretofore required the active alignment of the lens with the diode. The resultant apparatus, e.g., the previously discussed CIRCULASER™, is a low-divergence, low numerical aperture, highly efficient semiconductor laser diode assembly, with properties unmatched by other laser diodes.

Indeed, the advantages accruing to the CIRCULASER™ are only obtainable by the use of microlenses. In optical systems of the type described in U.S. Pat. No. 5,080,706, reducing the size of the optical elements thereof is generally regarded as having positive advantages in lens fabrication and accuracy. Indeed, the performance provided by the use of microlenses, i.e. lenses not substantially larger than about 1000 microns in diameter, is not attainable using macroscopic lenses.

U.S. patent application Ser. No. 08/725,151, entitled: "ELECTRO-OPTICAL DEVICE WITH INTEGRAL LENS", teaches an improvement to prior active alignment methodologies for mounting a long cylindrical microlens to a row of laser diode chips which has been cleaved from a wafer. According to this reference, the lens and the diode row are first positioned on a substrate. The long lens is then actively aligned to the diode row by powering at least one of the diodes and actively aligning the lens by inspection of the resultant laser beam formed in conjunction with the lens. Once aligned, the lens and diode are then fixed to establish their relative position. Finally, the lens/diode row is cut into individual diode chips. In this manner, the alignment "cost" is spread over a number of devices. While the methodology taught in this reference presents a substantial economy over the individual active alignment hitherto required, there still exists the need to actively align the diode row and the microlens.

While the previously discussed laser diode assemblies are fully effective for their intended use, the method of their manufacture has heretofore resulted in manufacturing inefficiencies. In any optical system, the alignment of the various optical elements is critical to the functioning of the system. This is certainly the case where a cylindrical microlens is incorporated into an optical system with a laser diode to provide a low-cost source of collimated light. As is typical of many optical applications, there are six degrees of freedom inherent in the positioning of the lens with respect to the laser diode, as shown in FIG. 1. Having reference to that figure, a cylindrical microlens, 100 is shown. The lens has three axes, X, Y and Z. The Z axis, 1, corresponds to the optical axis of the optical system. The X, 3, axis is transverse to the Z axis, 1, in the horizontal plane. The Y, 2, axis is also perpendicular to the Z axis but in the vertical direction. Positioning the lens along the X, Y, and Z axes defines the first three degrees of freedom. Furthermore, the lens may be rotated about each of these axes as shown at 10, 20, and 30, and each of these rotations also defines a degree of freedom with regard to alignment of the lens in the optical system. For cylindrical lenses, placement of the lens along the X axis, 3, is often not critical. In summary, the accurate alignment of a cylindrical microlens with respect to a semiconductor laser diode often requires precise alignment of one with the other with respect to five degrees of freedom.

One reason that alignment is required between lenses and other optical elements is that minor variations in lens geometry and size require correction. Moreover, the positional tolerances required to achieve optimal optical performance are exceptionally small: often less than two microns. This is particularly true along the Z axis, where positional accuracy is more often critical than along the Y axis, for instance. The achievement of this accuracy in positional alignment has heretofore generally been accomplished by some means of active alignment. With respect to microlenses, the act of heat-pulling the preform to draw the lens to its final size can produce microlenses which are either slightly over-pulled or under-pulled. Lenses having these "pulling errors" may very well present optical properties which are scaled versions of the intended lens. This presents a problem in prior attempts at passive alignment in that very small differences in physical dimension require different placement of the lens with respect to one or more degrees of freedom to effect proper alignment of the lens with respect to the diode or other device. While even a perfect lens has heretofore required some type of active alignment, pulling errors have absolutely mandated such a process.

A fairly typical active alignment methodology generally proceeds as follows: First, a section of cylindrical microlens is mounted on a small mounting bracket which because of its resemblance to a football goal post is referred to as a "goal post." It is intended that rotation about the X and Y axes is defined by the lens' position on the goal post. After the lens is mounted on the goal post, the goal post/lens assembly is then optically positioned along the Y and Z axes, and the lens affixed to the semiconductor laser diode. In order to perform these several alignments, a laser diode, usually the diode to which the lens will ultimately be assembled, is energized and the diode's laser beam directed through the lens to a screen. The operator manipulates the lens along and about the several axes until the projected beam meets the required specifications for the assembly. In this manner, movement along the several axes, as well as rotation about those axes is manipulated by an operator who assembles each lens and laser diode. The entire operation is very dependent on the skill of the operator, as the optical cement utilized first to affix the lens to the goal post and finally to the diode introduces a variable into the problem. This variable is engendered by the fact that the surface tension of the cement between the several elements on which it is used causes motion between those elements. This motion of course tends to misalign the optical elements. Active alignment methodologies are generally utilized to produce the devices taught in U.S. Pat. Nos. 5,081,639 and 5,181,224.

The term "passive alignment", as used herein, defines a process whereby the lens is aligned with respect to another device solely by mechanical means and thereafter secured in position with respect to the diode or other device. Examples of such mechanical means include mechanical jigs, fixtures, alignment blocks, and the like. Passive alignment does not require the projection of a beam of light through the lens, nor indeed manipulation of the lens with respect to beam alignment or performance. Passive alignment relies solely on the mechanical alignment of the lens with respect to the diode or other device to achieve the required optical alignment.

The term "semi-passive alignment", as used herein, defines an alignment methodology whereby the lens is aligned with respect to another device along at least one degree of freedom solely by mechanical means, i.e., passively. Examples of such mechanical means include mechanical jigs, fixtures, alignment blocks, and the like. Passive alignment does not require the projection of a beam of light through the lens, nor indeed manipulation of the lens with respect to beam alignment or performance. Passive alignment relies solely on the mechanical alignment of the lens with respect to the diode or other device to achieve the required optical alignment. Alignment with respect to one or more of the other degrees of freedom, where required, is effected by an active alignment scheme. The passive and active alignment steps in a semi-passive alignment methodology may be performed in any order.

Preferably, an ideal semi-passive alignment scheme performs the passive portion of the alignment along the most critical degree of freedom. This is often the alignment along the Z-axis. After all alignment is completed, the lens is secured in position with respect to the other device.

Significant effort has been expended to overcome the effects of pulling errors on the manufacturing efficiency of devices incorporating microlenses and other optical devices or elements. In general these methodologies, and the apparatus which perform them, can be divided into two classes: those which seek to increase the efficiency of the previously discussed active alignment process, and those which seek to achieve a passive alignment between the microlens and other optical elements.

While the method taught in U.S. patent application Ser. No. 08/725,151 spreads the active alignment "cost" over a number of devices, there still exists the need to actively align the diode row and the microlens taught therein. What is clearly needed is a methodology which will result in further substantial savings in skilled manpower currently required to accurately assemble a cylindrical microlens using current non-passive alignment methodologies. This advantage could be effected if some workable passive or semi-passive alignment methodology were made possible.

What is further needed is a methodology which enables the previously discussed passive or semi-passive alignment of a lens, particularly a cylindrical microlens, with respect to an electron device, particularly a laser diode, to less than 2 microns with respect to one or more degrees of freedom, most particularly along the Z axis of the microlens.

What is still further needed is a methodology which effects passive alignment while being relatively insensitive to changes in final microlens size resulting from pulling errors.

What is yet further needed is a methodology which scales its alignment with changes in size from one microlens to another.

The several references made herein to reference works and to issued and pending patents is to show the state of the art at the time the present invention was made. These references are herewith incorporated by reference.

DISCLOSURE OF THE INVENTION

The present invention teaches the use of at least one, and preferably a plurality of, alignment members formed integrally with the cylindrical microlens during its manufacture. The alignment members, or standoffs, may take several forms, but in the simplest form comprise an extension, or finger, of the proper optical length to effect at least partial passive alignment of the cylindrical microlens with another device, for instance a laser diode.

The alignment members incorporate at least one reference surface to effect alignment. In one preferred embodiment, at least one alignment member incorporates a plurality of reference surfaces whereby as many as five degrees of freedom are referenced and defined.

The cylindrical microlenses incorporating integral standoffs in accordance with the principles of the present invention can be used to manufacture a single lens/diode pair, or, in the alternative, can be used to fabricate a structure having a plurality of diodes or other electrical devices affixed to a length of cylindrical microlens, the diodes and lens forming a unity whole. This unitary whole may then be divisible into individual lens/diode pairs, or may include several diodes per lens.

The methodology enables the completely passive alignment of a lens, particularly a cylindrical microlens, with respect to an electron device, particularly a laser diode, to tolerances of less than 2 microns. with respect to one or more degrees of freedom.

The methodology effects completely passive alignment while being relatively insensitive to changes in final microlens size resulting from pulling errors, thereby scaling its alignment with changes in size from microlens to microlens. This feature is attainable because of a startling discovery regarding the formation of integral alignment members: changes in scale of the microlens occasioned by pulling errors induce changes in scale of the alignment members, which changes tend to be in the direction of desired correction!

In other words, where a cylindrical microlens is subject to a pulling error, the proportional reduction of the integral alignment member provides a degree of alignment correction which is not only in the correct direction, but is generally at least approximately correct with respect to the scale of required correction. By way of illustration, where a microlens is over-pulled, resulting in a slightly smaller lens than is desired, the correct alignment action, previously accomplished actively, would to move the microlens slightly closer to the laser diode. Utilizing the principles of the present invention, the proportional reduction of an integral alignment member occasioned by the reduction in scale of the entire microlens results in the reduction in length of the alignment member, which reduction is at least approximately in the correct scale of the requisite correction. Assuming that the integral alignment member is properly scaled during formation of the preform, the resultant microlens, when passively aligned, will remain in alignment without recourse to an active alignment regime.

BEST MODE OF CARRYING OUT THE INVENTION

Figure 1:
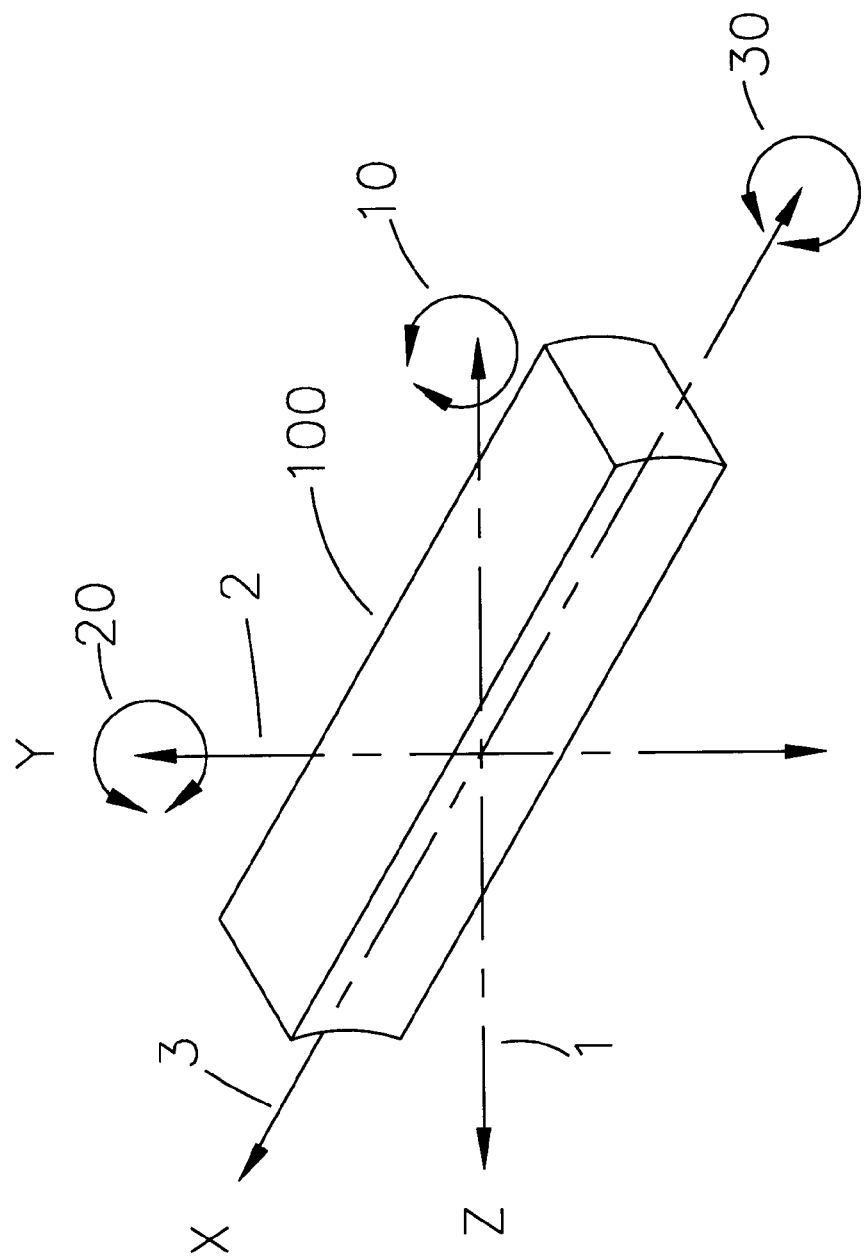
FIG. 1 is a depiction of the several axes defined by a cylindrical lens, and of the degrees of freedom inherent in these axes.
Figures 2A, 2B:
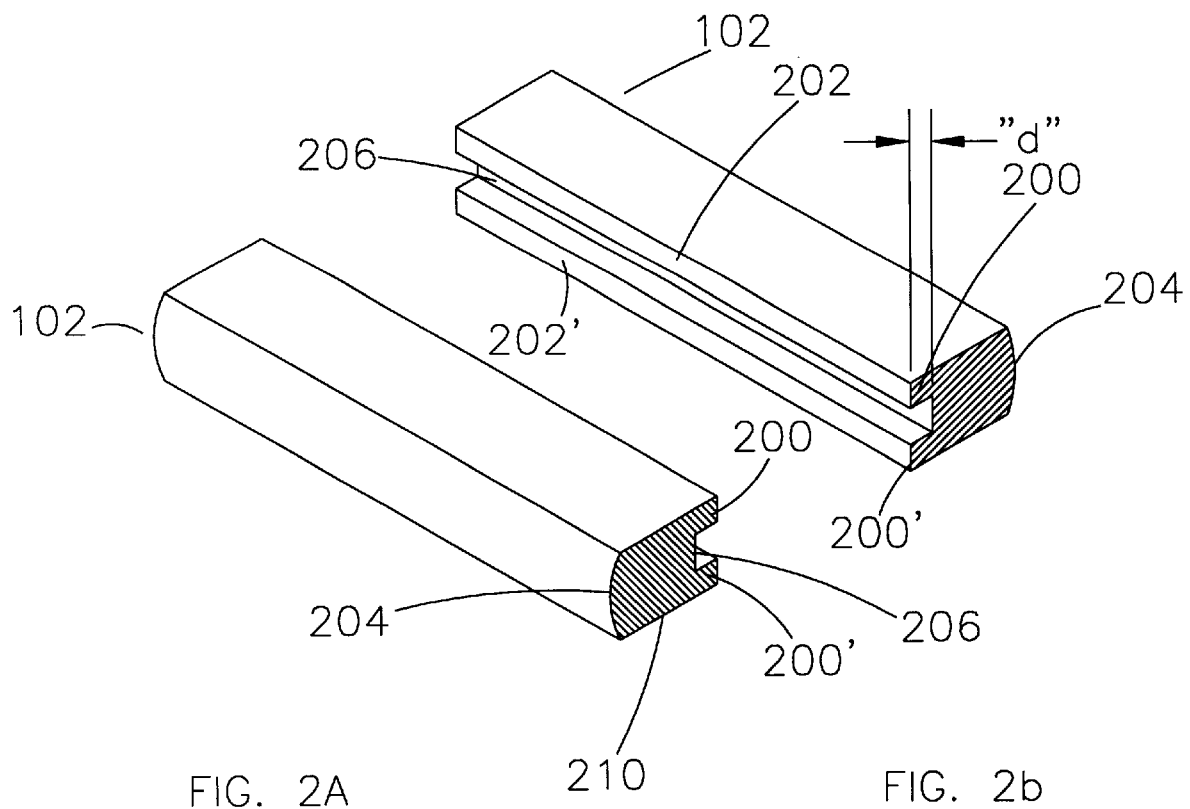
FIG. 2A is a front perspective view of a cylindrical microlens incorporating the principles of the present invention.
FIG. 2B is a rear perspective view of the cylindrical microlens of FIG. 2A.

Referring to FIGS. 2A and 2B, a simple cylindrical microlens, 102, incorporating the principles of the present invention is shown. Lens 102 is generally formed in accordance with the principles of the incorporated references, but with this difference: the preform from which the microlens is drawn is formed with at least one, and in this exemplar, a pair of integral alignment members or standoffs, 200 and 200'. Standoffs 200 and 200' extend a distance "d" from a first optical surface, 206, of the preform. In this embodiment, a second optical surface, 204, is formed in lens 102 opposite first optical surface 206, but the principles of the present invention contemplate lens or other optical element configurations where this is not the case. Distance "d" is calculated to generate the proper alignment distance in the Z axis (not shown) from the device to which the lens will later be aligned (not shown in this view). Moreover, the longitudinally extending surfaces, 202 and 202' defined by the piano-linear nature of standoffs 200 and 200', are reference surfaces which, in this embodiment enables the passive alignment with respect to three degrees of freedom: along the Z axis; about the Z axis; and about the Y axis.

Lens 102 is typically formed by the methodology of accurately forming a preform embodying all the features of the resultant microlens, then heating the preform to about its minimum drawing temperature, and finally pulling the microlens from the preform. Where lens 102 is slightly over-pulled, resulting in a microlens of slightly smaller profile than design specification, distance "d" of standoffs 202 and 202' is likewise proportionally smaller than design specification. This proportional reduction of distance "d" enables the advantages of the present invention. The reduction of distance "d" acts to move optical surface 206 slightly closer to the device, for instance a laser diode, to which microlens 102 is aligned and attached. This is exactly the correct direct to effect the desired correction occasioned by the slight reduction in scale occasioned by the over-drawing of lens 102. Moreover, the amount, or scale of reduction of distance "d" is at least approximately correct for the amount of correction required.

Figure 3:
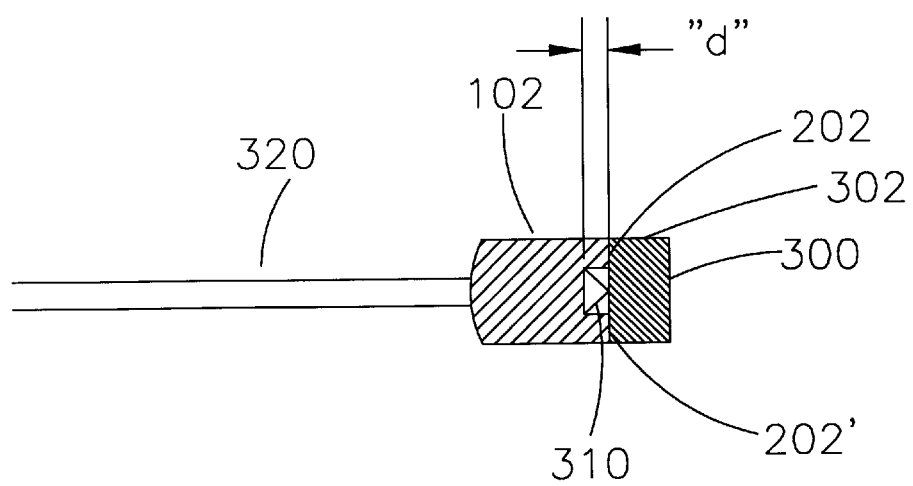
FIG. 3 is cross-sectional representation of the cylindrical microlens of FIG. 2A in operative combination with a laser diode, showing the laser beam entering and exiting the microlens.

An implementation whereby lens 102 is passively aligned with a laser diode 300 is shown at FIG. 3. Having reference to that figure, lens 102 is indexed on or aligned with a surface of laser diode 300. Emitted from the surface 302 of laser diode 300 is the widely divergent beam 310 typical of such devices. One optical surface of lens 102 is positioned a fixed non-zero distance "d" away from surface 302 of laser diode 300 by means of standoffs 202 and 202", which rest upon surface 302. In this embodiment standoffs 202 and 202' are urged into contact with surface 302, but are not otherwise attached thereto. One output beam, for instance the circularized laser beam of the previously discussed "CIRCULA-SER®" diode, is shown at 320.

One alternative to this embodiment contemplates the attachment of lens 102 to the surface 302 of laser diode 300, at standoffs 202 and 202'. This attachment may be accomplished by any attachment technique well-known to those of ordinary skill in the art. These techniques include, but are not necessarily limited to, soldering; brazing; the use of adhesives, monomeric, polymeric or otherwise; eutectic bonding; thermo-compression bonding; ultrasonic bonding; thermo-sonic bonding; and other attachment technologies well known to those of ordinary skill in the art.

The previously discussed embodiment has focused on an implementation where a first optical surface is flat and its opposite optical surface is curved. The principles of the present invention specifically contemplate its adoption on optical devices having zero to a plurality of curved optical surfaces and incorporating at least one integrally formed alignment element.

Figures 4A, 4B:
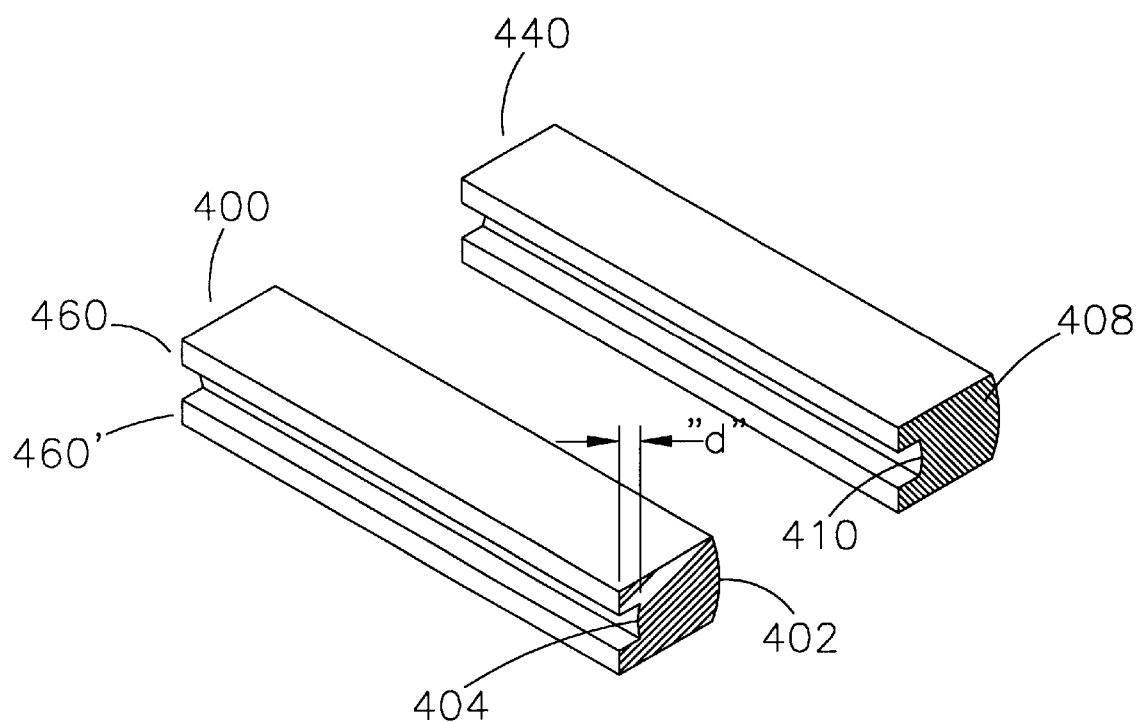
FIG. 4A is a front perspective view of a cylindrical microlens having a plurality of powered surfaces, formed in accordance with the principles of the present invention.
FIG. 4B is a front perspective view of another cylindrical microlens having a different plurality of powered surfaces, again formed in accordance with the principles of the present invention.

Referring to FIGS. 4A and 4B a pair of cylindrical microlenses 400 and 440 are disclosed each of which feature a plurality of curved optical surfaces. Cylindrical microlens 400 has a convex first optical surface 404 in operative and optical combination with a second convex second optical surface 402. Cylindrical microlens 404 has a concave first optical surface 410 in operative and optical combination with a second convex second optical surface 408. While not illustrated herein, it will be obvious those having ordinary skill in the art that substantially any combination of concave, convex, or flat surfaces may, with equal facility, be implemented in accordance with the teachings of the present invention. The present invention specifically contemplates all such implementations.

Figure 11:
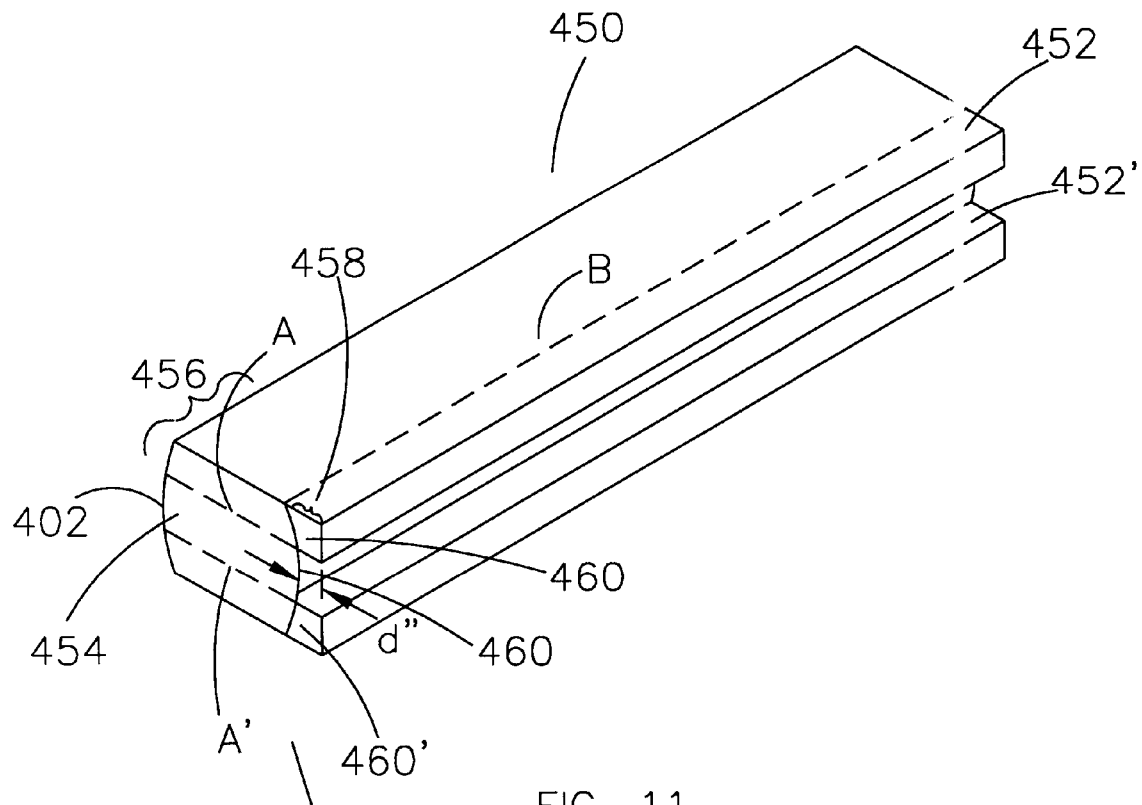
FIG. 11 is a perspective view of one embodiment of the present invention wherein the preform is implemented with discrete alignment members prior to formation of the microlens.

One embodiment of the present invention is particularly suitable to lens forms which do not lend themselves to internal grinding. One such form is shown in FIG. 4 as 400. The formation of optical surface 404 within a pair of alignment members 406 and 406' can be difficult. The embodiment shown in FIGS. 11 and 12 obviate this difficulty. Having reference now to FIG. 11, preform 450 is formed of at least two discrete components. In this exemplar preform 450 is composed of a first section defining optical surfaces 402 and 404, and a pair of discrete alignment members 452 and 452'. Alignment members 452 and 452 may take several forms. In one form, shown at 458, the alignment members are substantially rhomboidal elements having one face, 460 and 460', precisely matching the corresponding portion of optical surface 404. The edge of this embodiment is shown at "B".

A further alternative to this embodiment contemplates the formation of alignment elements which are substantially planar in aspect, and which form a portion 456 of at least one optical surface. This alternative is shown at "A" and "A'".

Figure 12:
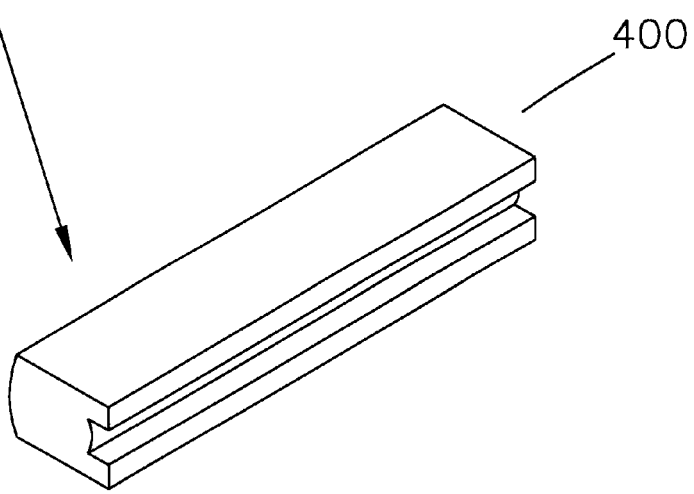
FIG. 12 is a perspective view of a microlens resulting from the preform of FIG. 11.

In either alternative, alignment elements 452 and 452' are precisely aligned with respect to preform body 454, and the assembly heated to at least the minimum drawing temperature for the preform material selected. Microlens 400, shown in FIG. 12, is then pulled from the preform as taught in at least one of the incorporated references. The heat/melt/stretch sequence serves to bond or weld the several elements of this embodiment into one physical and optical whole as shown at 400.

Figure 5:
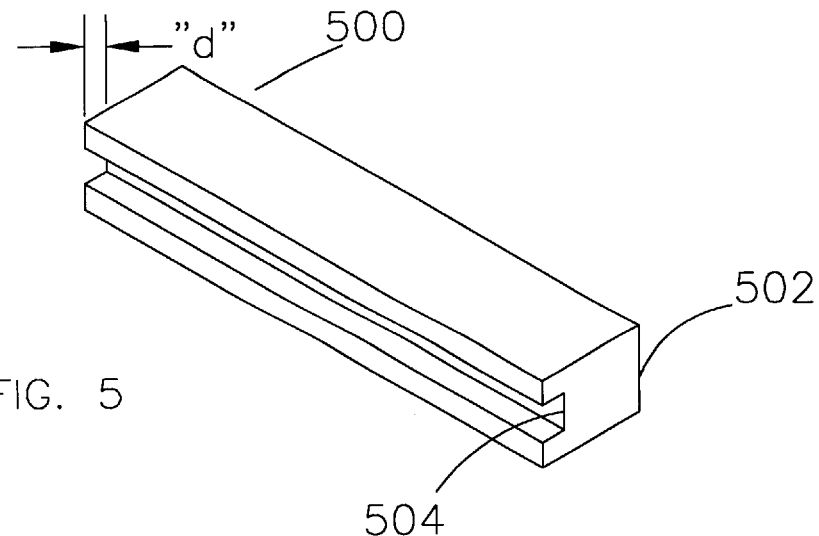
FIG. 5 is a front perspective view of a cylindrical optical spacer having no powered surfaces.

Another implementation of the present invention, wherein the optical element includes a plurality of flat surfaces, is shown at FIG. 5. Having reference to that figure, optical spacer 500 comprises an optical element having a first flat optical surface, 504 in operative and parallel optical combination with a second flat optical surface, 502. In this manner, optical spacer can serve to passively align a second optical device, not shown in this figure, with a third device. Similarly, optical surfaces 504 and 502 may, optionally, be formed in non-parallel alignment, thereby defining a microprism incorporating at least one integrally formed alignment element or standoff.

Figure 6:
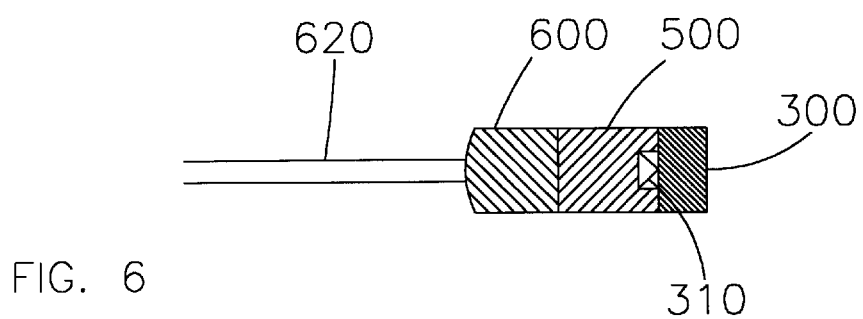
FIG. 6 is a cross-sectional representation of the cylindrical optical spacer of FIG. 5 in operative combination with a laser diode and a cylindrical microlens, showing the laser beam entering the spacer and exiting the microlens.

One use for the device previously described and shown at FIG. 5 is disclosed at FIG. 6. With reference to that figure, spacer 500 may be employed to effect a desired alignment between one optical device, in the case lens 600, and another device, here laser diode 300. Spacer 500 may be utilized to passively align cylindrical microlenses which do not include integral alignment elements, as shown in this figure, or to implement an alignment distance greater than would be feasible utilizing exceptionally long integrally formed alignment elements. The divergent beam output from diode 300 is shown at 300 and the resultant beam formed by the operative combination of diode 300, spacer 500 and lens 600 is shown at 620. Again, the attachment of these several elements may be accomplished by any attachment technique well-known to those of ordinary skill in the art. These techniques include, but are again not necessarily limited to, soldering; brazing; the use of adhesives, monomeric, polymeric or otherwise; eutectic bonding; thermo-compression bonding; ultrasonic bonding; thermo-sonic bonding; and other attachment technologies well known to those of ordinary skill in the art.

Figure 7:
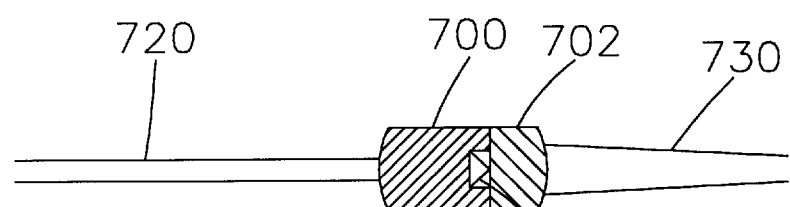
FIG. 7 is a is cross-sectional representation of the cylindrical microlens of FIG. 2A in operative combination with a second cylindrical microlens, showing the laser beam entering the second microlens and exiting the first microlens.

While the previous discussions have largely centered on the utilization of the principles of the present invention applied to the formation of cylindrical microlens/diode devices, study of these principles makes obvious the fact that they may, with facility, be implemented on a broad range of optical devices. One such implementation is shown at FIG. 7, where a cylindrical microlens incorporating at least one integrally formed alignment element, 700, is passively aligned with, and subsequently attached to, a second lens, 702. In this example, an input beam, 730, is focused into lens 702, which lens further focuses it into cylindrical microlens 700 which forms output beam 720. The principles of the present invention specifically contemplate the implementation of those principles on a broad array of optical devices including, but not necessarily limited to one or more: lenses; prisms; etalons; diffraction gratings; optical fibers; fresnel lenses; mirrors; holograms; holographic diffraction gratings; beam splitters; polarizing optical elements; wave plates; graded index optical elements; attenuators; filters; apertures; and apodizers in operative combination.

The previously discussed applications of the present invention enable the passive or mechanical alignment of a cylindrical microlens with respect to another device, for instance an electronic device, along one axis. In the exemplars previously discussed, this axis is often the Z or optical axis, as this axis is often the most critical alignment in the formation of an electro-optical device. Study of the principles taught herein reveals that passive alignment may be accomplished with respect to the other degrees of freedom inherent in the design of a cylindrical lens. The principles taught herein specifically contemplate all such embodiments.

Further, the use of a pair of alignment surfaces formed orthogonally to one another, each of which is orthogonal to the Z axis. This arrangement enables passive alignment of a cylindrical microlens with respect to another device with respect to five degrees of freedom. A simple implementation of this concept contemplates the use of one of the surfaces of the microlens, for instance lower surface 210 shown at FIG. 2A as a second alignment surface. While the previously discussed implementations enabled passive alignment along the Z axis, by using surface 210 as an alignment surface in operative combination with another surface of the electronic device, passive alignment with respect to five degrees of freedom is enabled.

Figure 8:
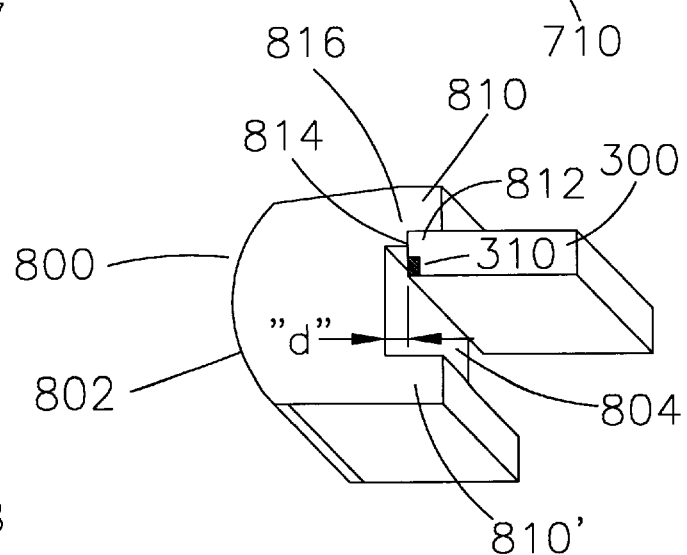
FIG. 8 is a rear upward perspective view of another cylindrical microlens formed in accordance with the principles of the present invention, further incorporating a plurality of reference surfaces.

Having reference now to FIG. 8, the use of a pair of alignment surfaces, 812 and 814, formed on a cylindrical microlens, 800 is shown. Microlens 800 is formed with a first and second optical surfaces, 804 and 802; a first alignment surface, 814 and a second alignment surface, 812. Microlens 800 also shows another feature which eliminates registry errors occasioned by formation errors at the junction of surfaces 812 and 814. This feature is a relief groove, 816, which ensures that only surfaces 812 and 814 are in contact with electron device 300, thereby eliminating errors in forming the juncture of surfaces 812 and 814 from adversely affecting the alignment process.

By implementing a microlens, as 800, with a pair of orthogonally disposed alignment surfaces 812 and 814, which surfaces are further orthogonally disposed with respect to the Z axis, passive alignment of the lens with respect to another device, here a laser diode 300, is enabled. This alignment is explained as follows: urging surface 314 into intimate contact with surface 814 aligns microlens 800 with diode 300 with respect to the Z axis. Urging surface 312 into intimate contact with surface 812, in and of itself, aligns lens 800 with diode 300 with respect to the Y axis. If the two urging actions are performed in operative combination with one another, further advantages eventuate. The combination of the two alignments not only aligns the lens and diode along the Z and Y axes, but also aligns these two elements around all three axes. Hence the principles of the present invention applied as shown in FIG. 8 results in the alignment of lens 800 and diode 300 with respect to five degrees of freedom.

Moreover, where a lens is slightly over- or under- pulled, acceptable alignment is effected without further action. This automatic correction for pulling errors is explained as follows: a small over-pull results in the proportional scalar reduction of every dimension of the lens. This reduction in scale occurs at all dimensions, including the length of standoffs 810 and 810'. The required correction for a lens smaller than specified is to move the lens closer to the light source to the lens. The reduction in scale, and hence elevation, of standoffs 810 results in a proportional reduction of distance "d". When surface 814 of microlens 800 is urged into contact with surface 314 of laser diode 300, the reduction in distance "d" occasioned by the over-pull results in moving optical surface 804 of lens 800 closer to emitter 310 of diode 300: exactly the desired corrective direction along the Z axis. Moreover, the surprising result obtained during development of the present invention is that this correction is not only in the proper direction, but is also at least approximately correct with respect to the required amount of the correction. In other words, the scalar reduction in distance "d" is acceptably close to the perfect correction required to optically align the over-pulled lens for most applications. Indeed, initial experimentation by the inventor indicates that in many implementations, the amount of correction is precisely proportional to the degree of mispulling. A similar, but opposite effect occurs where the lens is under-pulled.

In similar fashion, an over-pull results in the scalar reduction of the distance between the centerline 820 of the microlens and alignment surface 812, hereafter referred to as distance "x". This action, like that previously discussed results in an automatic correction in the correct direction along the Y axis, and again, the amount of the correction is at least approximately correct.

Figure 9:
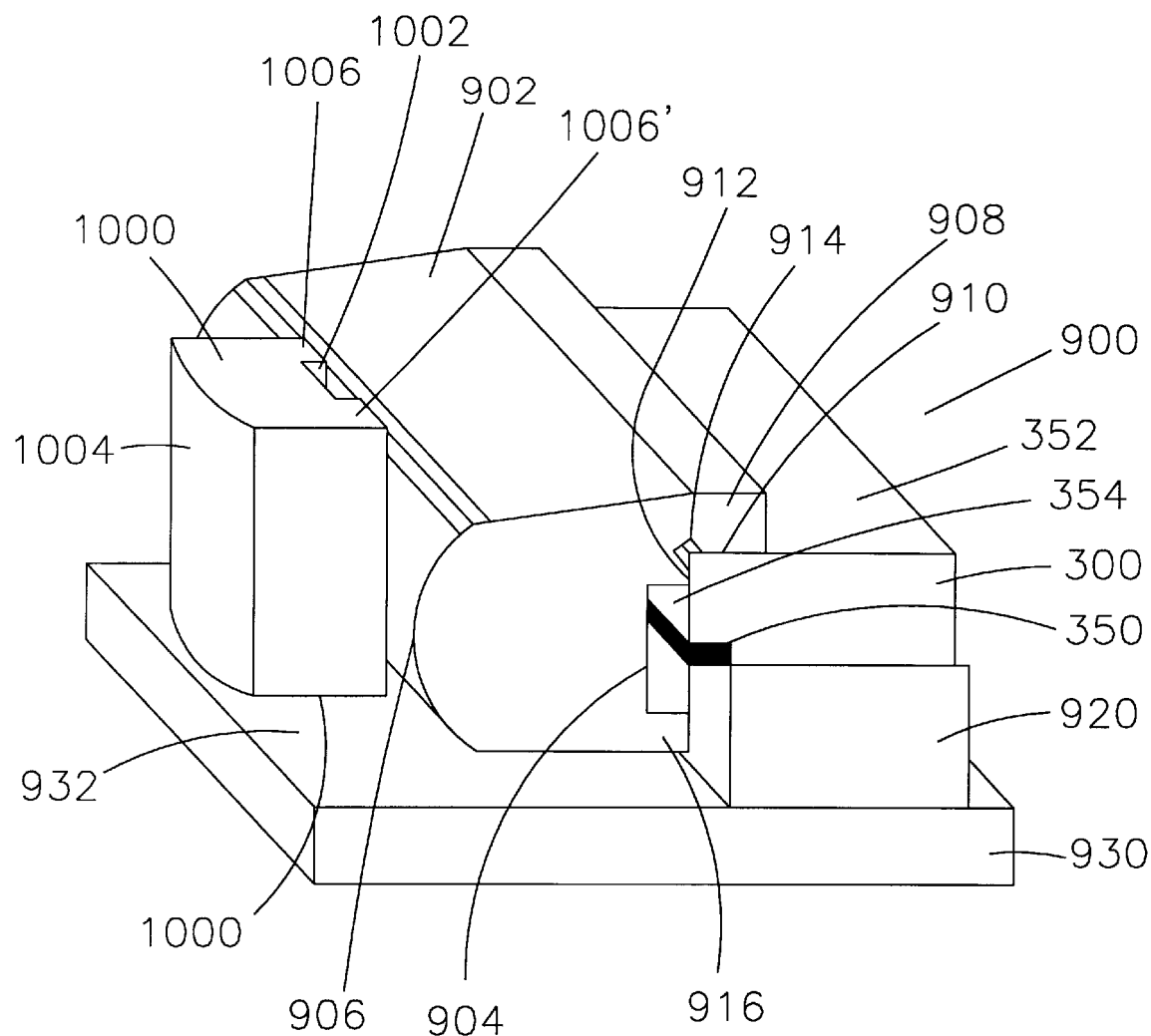
FIG. 9 is a front perspective view of the device of FIG. 8., mounted on a substrate and in operative combination with a second, crossed, microlens.
Figure 10:
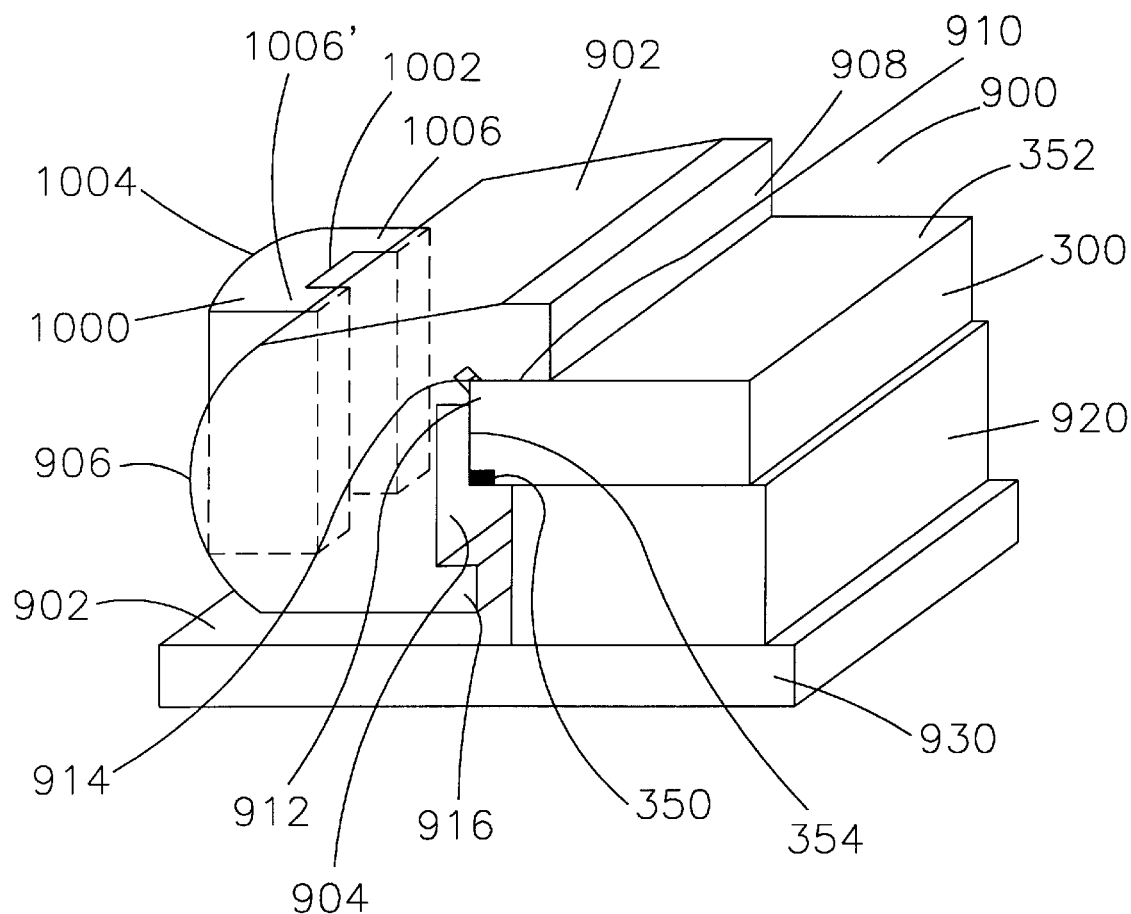
FIG. 10 is a rear perspective view of the device of FIG. 9.

By combining the alignment actions of mating surfaces 814/314 and 812/312, further advantages eventuate. The combination of the alignments results not only in alignment along the Z and X axes, but also, from geometry, about the X, Y, and Z axes. Accordingly, passive alignment of the lens to the diode or other device is achieved with respect to five degrees of freedom. One device implementing these principles is shown at FIGS. 9 and 10.

The present invention further contemplates methodologies whereby passive alignment is attainable along two axes and about all three axes of the lens. Accordingly, it will be appreciated that the principles hereinafter enumerated enable passive alignment of a cylindrical microlens with respect to another device with respect to five degrees of freedom.

The previous exemplars of the present invention have discussed implementations wherein the integrally formed alignment members are substantially plano-linear in aspect. The use of a plurality of alignment surfaces formed at angles to one another present further advantages. An example of a device implementing such an arrangement is shown at FIGS. 9 and 10.

Having reference to those figures, a first cylindrical microlens 900 is formed with at least one integral alignment member 908. Member, or standoff, 908 is further provided with a pair of alignment surfaces 910 and 912. In this embodiment reference surfaces 910 and 912 are longitudinally disposed and orthogonal to one another, but alternative angles may, with equal facility, be implemented. This embodiment incorporates a relief groove, 914 which ensures that alignment surfaces 910 and 912 mate flushly with the device to which the microlens will ultimately be aligned. Cylindrical microlens 902 in this example includes a first, planar, optical surface 904 and a second optical surface 906 in operative and optical cooperation therewith. As previously discussed, substantially optical profile may, with equal facility, be implemented. A further alignment member, 916 may also be provided. Study of FIGS. 9 and 10 reveals that alignment members 908 and 916 are asymmetrical, and the principles of the present invention specifically contemplate the use of such in some embodiments thereof.

Device 900 depicted herein is an embodiment of the present invention applied to a device of the type taught and claimed in U.S. patent application Ser. No. 08/837,004, which is herewith incorporated by reference. Device 900 further incorporates a second cylindrical microlens 1000, including a first optical surface 1002, as second optical surface 1004, and a pair of integrally formed alignment members 1006 and 1006'. Second cylindrical microlens 1000 is, in this embodiment, mounted orthogonally to first cylindrical microlens 902.

Device 900 further includes: a laser diode 300; and substrate elements 920 and 930. Laser diode includes an emitter, or "p" face 35, and at least two planar surfaces 352 and 354.

The passive alignment enabled by the principles of the present invention is explained as follows: first microlens 902 is mated and mechanically aligned with laser diode 300 by placing surfaces 352 and 354 in juxtaposition with alignment surfaces 910 and 912 arrayed on alignment member 908 of microlens 902. A clamp or jig (not shown) maintains microlens 902 and diode 300 in perfect alignment while they are attached one to the other utilizing any of the previously discussed attachment methodologies. This alignment and subsequent attachment results in the passive alignment of cylindrical microlens 902 with diode 300 with respect to five degrees of freedom: along the Z and Y axes; and about the Z, Y, and X axes.

Following attachment, the combined microlens/diode pair 902/300 may then be further mounted to a substrate, in this exemplar substrate elements 920 and 930. In this exemplar substrate elements 920 and 930 are generally planar members, the several surfaces of which are substantially orthogonal to one another. Again, a jig or clamp maintains the alignment of the microlens/diode pair 902/300 while it is attached to the several substrate elements. Where the substrate is a multi-part structure, as shown in the present figures, the attachment of microlens/diode pair 902/300 thereto may proceed either with the attachment of the several elements of the substrate, or as a discrete step in conjunction therewith At this point, the resultant device could be used to form a device of the "CIRCULARIZER™" type, previously discussed.

With the addition of second microlens 1000 to the assembly including microlens/diode pair 902/300 and substrate elements 920 and 930, a device of the type found in U.S. patent application Ser. No. 08/837,004 may be passively aligned formed. The final formation proceeds as follows: the assembly including microlens/diode pair 902/300 and substrate elements 920 and 930 includes a surface, 932, of substrate element 930. By carefully forming surface 1008 of second cylindrical microlens 1000 to be orthogonal to its other surfaces, the simple placement of surface 1008 on surface 932 results in an orthogonal relationship between first microlens 902 and second microlens 1000. Additionally, integrally formed alignment members 1006 and 1006' of second microlens 1000 in operative combination with surfaces 932 and 1008 provide the proper alignment with respect to all six degrees of freedom of second microlens 1000 and first microlens 902. The passive alignment of second microlens 1000 with first microlens 902 followed by attachment of second microlens 1000 to at least one of surface 932 and first microlens 902 results in the crossed lens device taught in U.S. patent application Ser. No. 08/837,004.

Finally, while the preceding discussion has centered on the notion of forming one microlens with one diode, study of U.S. patent application Ser. No. 08/725,151 reveals that the principles enumerated herein are further applicable to that technology, and to devices formed thereby. Indeed, the principles of the present invention specifically contemplate the elimination of the active alignment taught in that reference, thereby rendering it an even greater improvement over prior active alignment schemes. U.S. patent application Ser. No. 08/725,151 is herewith incorporated by reference.

The present invention has been particularly shown and described with respect to certain preferred embodiments of features thereof. However, it should be readily apparent to those of ordinary skill in the art that various changes in modifications in form and detail made be made without departing from the spirit and scope of the invention as set forth in the appended claims. In particular, changes in materials, dimensions, optical prescriptions, lens geometries, optical device descriptions, attachment methodologies, number of alignment elements and alignment surfaces as well as alignment surface angles needed to meet the requirements of a particular application are specifically contemplated by the principles of the present invention. The invention disclosed herein may be practiced without any element which is not specifically disclosed herein.

What is claimed is:

1. A cylindrical microlens capable of passive alignment with another device, the microlens comprising:

a cylindrical microlens having a first optical surface and a second optical surface;

a single alignment member disposed on said microlens, said member extending parallel to a Z-axis of said microlens and having a distal end;

said distal end including a contact flat; and the length of said alignment member being such that when said contact flat is contacted to a single surface of said device, the first optical surface of said microlens is positioned at a proper alignment distance from said device.

2. A microlens as in claim 1 wherein the length of said alignment member is such that upon contact with said single surface of said device, said microlens is passively aligned with said microlens with respect to the Z-axis.

3. A microlens as in claim 1 wherein said device comprises a laser diode and said contact flat contacts an emitter surface of said laser diode.

4. A microlens as in claim 1 wherein said alignment member is rectangular in shape.

5. A combination as in claim 3 wherein said laser diode is mounted on a substrate.

6. In combination, a cylindrical microlens passively aligned with a laser diode, said combination comprising:

a cylindrical microlens having a first optical surface and a second optical surface;

a laser diode including an emitting surface;

a single alignment member disposed on said microlens, said member extending parallel to a Z-axis of said microlens and having a distal end;

said distal end including a contact flat; and the alignment member extending a distance such that when said contact flat is contacted to the emitting surface of said diode, the first optical surface of said microlens is positioned at a proper optical distance from said diode.

7. A combination as in claim 6 wherein the dimensions of said alignment member are such that when the alignment member is urged into contact with said emitting surface of said diode, the microlens of the combination is passively aligned with the laser diode with respect to the Z-axis.

8. A combination as in claim 7 wherein the diode is mounted on a substrate.

9. A microlens as in claim 6 wherein said alignment member is rectangular in shape.

10. A cylindrical microlens capable of passive alignment with another optical device in a Z-axis, the microlens comprising:

a drawn cylindrical microlens having a first optical surface and a second optical surface;

at least one integral alignment member disposed on said microlens, said member extending perpendicular to the focal plane of said microlens and terminating in a contact flat; and the length of said alignment member defining a proper distance between said contact flat and said microlens.

11. A cylindrical microlens as in claim 10, wherein said at least one alignment member comprises a single alignment member.

12. A cylindrical microlens as in claim 11, wherein the contact flat of said single alignment member contacts a single surface of said optical device;

the length of said single alignment member being such that when said contact flat is contacted to said single surface of said optical device, the microlens is positioned at a proper alignment distance from said optical device; and whereby the contact flat, being urgeable into contact with said single surface of the optical element, enables the passive alignment of the cylindrical microlens with the optical device with respect to at least one degree of freedom.

13. A cylindrical microlens as in claim 12, wherein said optical device comprises a laser diode and said single surface of the optical device is the emitting facet of said diode.

14. A cylindrical microlens as in claim 10 wherein said alignment member further includes a rabbet.

15. A cylindrical microlens as in claim 14 wherein said rabbet has a vertical wall and a horizontal wall, the vertical wall being orthogonal to said Z-axis and the horizontal wall being orthogonal to a Y-axis.

16. A cylindrical microlens as in claim 15 wherein the vertical wall and the horizontal wall of said rabbet intersect, forming a juncture, a relief being formed at said juncture.

17. An electro-optical device incorporating the cylindrical microlens of claim 10.

18. A cylindrical microlens as in claim 10, wherein said at least one alignment member comprises two alignment members disposed on said cylindrical microlens, said microlens being sandwiched between said alignment members;

said two alignment members each having a contact surface at one end; and each of said two alignment members having a length, said length defining a distance between said contact surface and said first optical surface; and the length of said two alignment members being such that when said two contact surfaces are contacted to a single surface of said optical device, the first optical surface of said microlens is positioned at a proper optical distance from said optical device.

19. An electro-optical device incorporating the cylindrical microlens of claim 18.

20. The cylindrical microlens of claim 18, wherein said cylindrical microlens includes a first non-optical surface and a second non-optical surface;

said first non-optical surface and second non-optical surfaces being coplanar with an X-Z plane;

one of said two alignment members being disposed on said first non-optical surface; and another of said two alignment members being disposed on said second non-optical surface, said microlens being sandwiched between said two alignment members.

21. The cylindrical microlens of claim 20, wherein said two alignment members are oriented substantially parallel to each other.

22. A cylindrical microlens for passive alignment with a laser diode by contacting a single surface of said diode, the microlens comprising:

a drawn cylindrical microlens having a first optical surface, a second optical surface, and a plurality of non-optical surfaces;

said plurality of non-optical surfaces including a first non-optical surface and a second non-optical surface;

a first alignment member and a second alignment member;

said first alignment member disposed on said first non-optical surface, said first member extending perpendicular to the focal plane of said microlens and terminating in a first contact flat;

said second alignment member disposed on said second non-optical surface, said second non-optical surface being coplanar to said first non-optical surface, said second member extending perpendicular to the focal plane of said microlens and terminating in a second contact flat; and the length of said first and second alignment members being such that, when said first and second contact flats are contacted to said diode, the diode and said microlens are at a proper distance from each other.

23. The cylindrical microlens of claim 22, wherein said first and second contact flats of said alignment members are contacted to a single surface of said laser diode.

24. The cylindrical microlens of claim 23, wherein said single surface of said diode is the emitter facet of said diode.

25. The cylindrical microlens of claim 24, wherein said laser diode is mounted on a substrate.

26. A microlens capable of passive alignment with another optical device, the microlens comprising:

a cylindrical microlens body;

at least one alignment member disposed on said microlens body, each alignment member having a distal end;

said at least one alignment member having a length which defines a proper distance between said microlens body and said device; and said distal end of said at least one alignment member, being urgeable into contact with a single surface of said device to enable the passive alignment of the microlens body with the device with respect to at least one degree of freedom.

27. A microlens as in claim 26 wherein said length of the alignment member length is related to the optical properties of the microlens.

28. A microlens as in claim 26 wherein said length of the alignment member is related to the size of the microlens body.

29. The microlens of claim 26 wherein the length of said alignment member extends parallel to a Z-axis of said microlens, said length being related to the size and curvature of the cylindrical microlens.

30. The microlens of claim 26, wherein said at least one alignment member comprises a single alignment member.

31. The cylindrical microlens of claim 26, wherein said at least one alignment member comprises a pair of alignment members, both of said members being urgeable into contact with a single surface of said device enabling passive alignment of said microlens with the device with respect to at least one degree of freedom.

* * * * *

UNITED STATES PATENT AND TRADEMARK OFFICE
CERTIFICATE OF CORRECTION

PATENT NO : 6,078,437
DATED : JUNE 20, 2000
INVENTOR(S): STEPHEN L. KWIATKOWSKI

It is certified that error appears in the above-identified patent and that said Letters Patent are hereby corrected as shown below:

In Column 7, Line 12: Please delete [piano-linear] and replace with --plano-linear--.

Signed and Sealed this

Third Day of April, 2001

*Attest:*

NICHOLAS P. GODICI

*Attesting Officer*   Acting Director of the United States Patent and Trademark Office